US006868351B1

(12) United States Patent
Schoch et al.

(10) Patent No.: US 6,868,351 B1
(45) Date of Patent: Mar. 15, 2005

(54) DISPLACEMENT BASED DYNAMIC LOAD MONITOR

(75) Inventors: Daniel A. Schoch, Minster, OH (US); Titus Broek, Sidney, OH (US)

(73) Assignee: The Minster Machine Company, Minster, OH (US)

( * ) Notice: Subject to any disclaimer, the term of this patent is extended or adjusted under 35 U.S.C. 154(b) by 398 days.

(21) Appl. No.: 09/678,183

(22) Filed: Oct. 2, 2000

Related U.S. Application Data

(60) Provisional application No. 60/160,170, filed on Oct. 19, 1999.

(51) Int. Cl.[7] ............................ G01R 13/00; B30B 5/00

(52) U.S. Cl. ............................ 702/71; 702/41; 702/67; 702/189; 100/257; 72/20.1

(58) Field of Search ............................ 702/66–71, 72, 702/73, 41, 183, 189; 700/206, 183; 72/20.1–20.5, 21.3; 100/43, 48, 224

(56) References Cited

U.S. PATENT DOCUMENTS

| | | | | | |
|---|---|---|---|---|---|
| 3,869,927 | A | * | 3/1975 | Lose et al. | 74/44 |
| 3,885,283 | A | * | 5/1975 | Biondetti | 492/7 |
| 4,309,893 | A | * | 1/1982 | Mueller | 72/455 |
| 4,386,304 | A | * | 5/1983 | Bergmann et al. | 318/561 |
| 4,504,920 | A | | 3/1985 | Mickowski | 702/183 |
| 4,563,271 | A | * | 1/1986 | Schroder et al. | 209/427 |
| 4,619,396 | A | * | 10/1986 | Yamamoto | 228/102 |
| 4,633,720 | A | | 1/1987 | Dybel et al. | 73/862.53 |
| 4,750,131 | A | | 6/1988 | Martinez | 700/206 |
| 4,819,467 | A | | 4/1989 | Graf et al. | 72/20.1 |
| 4,918,956 | A | | 4/1990 | Schoch | 72/21.1 |
| 4,939,665 | A | | 7/1990 | Gold et al. | 700/206 |
| 4,945,742 | A | | 8/1990 | Schoch | 72/17.2 |
| 4,987,528 | A | | 1/1991 | O'Brien | 700/79 |
| 5,068,779 | A | | 11/1991 | Sullivan et al. | 700/56 |
| RE33,783 | E | * | 12/1991 | Spehrley et al. | 358/494 |
| 5,099,731 | A | * | 3/1992 | Eigenmann | 83/74 |
| 5,113,756 | A | * | 5/1992 | Fujii | 100/48 |
| 5,119,311 | A | | 6/1992 | Gold et al. | 700/206 |
| 5,130,584 | A | * | 7/1992 | Faitel | 310/17 |
| 5,140,834 | A | | 8/1992 | Kashiwagi et al. | 72/15.2 |
| 5,142,769 | A | | 9/1992 | Gold et al. | 29/621.1 |
| 5,182,935 | A | * | 2/1993 | Schockman | 72/417 |
| 5,199,290 | A | | 4/1993 | Kashiwagi et al. | 72/15.2 |
| 5,224,053 | A | | 6/1993 | Cook | 700/206 |
| 5,269,163 | A | | 12/1993 | Yagi et al. | 72/20.1 |
| RE34,559 | E | * | 3/1994 | Mickowski | 702/183 |
| 5,297,478 | A | | 3/1994 | Jartyn et al. | 100/35 |
| 5,379,688 | A | | 1/1995 | Ishii | 100/35 |
| 5,409,188 | A | * | 4/1995 | Takagi et al. | 244/195 |
| 5,440,478 | A | | 8/1995 | Fisher et al. | 700/109 |
| 5,491,647 | A | | 2/1996 | O'Brien et al. | 701/99 |
| 5,493,959 | A | | 2/1996 | Yagi et al. | 100/43 |
| 5,555,757 | A | * | 9/1996 | Smith et al. | 72/88 |
| 5,720,988 | A | * | 2/1998 | Yoneda | 425/150 |
| 5,746,122 | A | | 5/1998 | Gietz et al. | 100/43 |
| 5,847,902 | A | * | 12/1998 | Clifford et al. | 360/245.6 |
| 5,870,254 | A | * | 2/1999 | Baserman et al. | 360/244.6 |
| 5,913,956 | A | * | 6/1999 | Capps | 83/39 |
| 5,997,778 | A | * | 12/1999 | Bulgrin | 264/40.1 |
| 6,035,775 | A | * | 3/2000 | Nghiem | 100/43 |
| 6,381,564 | B1 | * | 4/2002 | Davis et al. | 703/22 |
| 6,484,106 | B1 | * | 11/2002 | Schoch | 702/34 |
| 6,523,384 | B1 | * | 2/2003 | Schoch | 72/20.1 |

* cited by examiner

*Primary Examiner*—Hal Wachsman
*Assistant Examiner*—Jeffrey R. West
(74) *Attorney, Agent, or Firm*—Randall J Knuth

(57) ABSTRACT

An apparatus and method for monitoring the force severity of a mechanical press able to do so without utilizing a contact force sensor. The method continually computes values of dynamic deflection for the press being monitored and utilizes these values to compute load on the press at any point in time. Also provided is a method and apparatus for generating a theoretical slide displacement curve and an actual displacement curve as well as a system for comparing such curves.

22 Claims, 6 Drawing Sheets

DISPLACEMENT BASED DYNAMIC LOAD MONITOR

REFERENCE TO RELATED APPLICATION

This application claims benefit of the provisional application No. 60/160,170 filed Oct. 19, 1999.

BACKGROUND OF THE INVENTION

1. Field of the Invention

The present invention relates generally to an apparatus and method for monitoring press force severity and press load. Specifically, the present invention relates to a method and apparatus for monitoring dynamic press load without the use of a contact force sensor.

2. Description of the Related Art

Mechanical presses of the type performing stamping and drawing operations employ a conventional construction which includes a frame structure having a crown and a bed and which supports a slide in a manner enabling reciprocating movement toward and away from the bed. These press machines are widely used for a variety of workpiece operations employing a large selection of die sets with the press machine varying considerably in size and available tonnage depending upon its intended use.

A press applies force to a workpiece so that the workpiece (i.e. stock material) acquires the desired geometry corresponding to the die set being utilized. Systems for monitoring press operating reliability assist the press owner in evaluating the impact of certain die/load applications on the reliability of the press being monitored. Conventional monitoring systems include systems which utilize contact load sensors to monitor the peak load being developed within certain components of the press machine during a slide stroke of the press. Known methods of monitoring peak loads utilize an electrical resistance or piezoresistive strain gage or other transducer which is mounted on the press and which voltage change due to resistive change indirectly measures a value of applied load. Monitoring load exerted on load bearing members during a slide stroke of a mechanical press allows press and die applications to be adjusted when monitored peak load values are outside an acceptable range.

What is needed in the art is an apparatus and method to compute the load on a press without utilizing a contacting load sensor.

SUMMARY OF THE INVENTION

The present invention provides a method and apparatus for the identification of dynamic load on a mechanical press which does not require a contact load sensor.

More specifically, the method and apparatus of the present invention continually computes a theoretical no load slide displacement curve while also creating an actual slide displacement curve during a load condition of the mechanical press. The apparatus and method of the current invention then employs a curve matching technique to superimpose these two curves so that values of dynamic deflection at different points in the slide path may be computed. Values of dynamic deflection are then utilized in conjunction with a constant corresponding to the static stiffness of the press to calculate load on the press.

The invention, in one form thereof, comprises a method of generating a theoretical slide displacement curve for a mechanical press. This method includes the steps of: providing an equation that can be utilized to calculate slide displacement as a function of press speed and which includes variables to account for press parameters which effect slide displacement; providing a computational device; determining the speed of the press; determining the aforementioned equation variables; communicating the equation, the speed of the press and the equation variables to the computational device; calculating the theoretical distance above bottom dead center for each increment of a slide stroke; and plotting the calculated distance above bottom dead center values vs. time. The step of determining the equation variables can further include the steps of: determining the appropriate variable corresponding to the press drive mechanism of the mechanical press, determining the appropriate variable corresponding to the connecting rod length of the mechanical press, determining the appropriate variable corresponding to the stroke length of the mechanical press, and determining the appropriate variable corresponding to the bearing size of the mechanical press.

The invention, in another form thereof, comprises a speed sensor for sensing a value of press speed, input means for inputting a plurality of variables corresponding to characteristics of the monitored press, computer storage means for storing an equation which can be used for generating the theoretical slide displacement curve, and a computer processor means for generating the theoretical slide displacement curve. In this form of the invention, the computer processor means are communicatively connected to the sensor means, the input means and the storage means. The equation utilizes the plurality of variables corresponding to characteristics of the press and the value of press speed to generate the theoretical slide displacement curve. The plurality of variables input via the input means can include a value of connecting rod length, a value of stroke length, a value of drive type, and a value of bearing size.

The invention, in another form thereof, comprises a method of monitoring performance parameters for a mechanical or hydraulic press. This method includes the steps of: generating a theoretical no load slide displacement curve, generating an actual slide displacement curve during a load condition of the press, determining the contact point on the actual slide displacement curve which corresponds to the slide contacting the stock material, establishing a start point on the slide downstroke between top dead center and the contact point, establishing an end point on the slide upstroke between top dead center and the contact point, identifying the points on the theoretical slide displacement curve corresponding to the start point and the end point, identifying the points on the actual slide displacement curve corresponding to the start point and the end point, superimposing the identified start points on the theoretical and actual slide displacement curves, and superimposing the identified end points on the theoretical and actual slide displacement curves. In this form of the invention, the step of generating a theoretical no load slide displacement curve may further comprise the steps of: providing an equation that can be utilized to calculate slide displacement as a function of press speed which equation includes variables corresponding to press drive mechanism, connecting rod length, stroke length and bearing size; determining the speed of the press; determining the appropriate variable corresponding to the press drive mechanism of the mechanical press; determining the appropriate variable corresponding to the connecting rod length of the mechanical press; determining the appropriate variable corresponding to the stroke length of the mechanical press; determining the appropriate variable corresponding to the bearing size of the press; providing a computational device; communicating the equation, the speed of the press and the equation variables to the computational device; calculating the theoretical distance above bottom dead center for each time increment of a slide stroke; and plotting the calculated distance above bottom dead center values for each time increment vs. time. The step of generating an actual slide displacement curve during a load condition of the press can be accomplished by monitoring the displacement of the slide of the press with either a contact or a non-contact displacement sensor and plotting the monitored slide displacement vs. crank angle or time. A first inflection point corresponds to the point at which the slide contacts the stock material (i.e. the contact point).

The invention, in another form thereof, comprises a method of monitoring performance parameters for a mechanical press. This method includes the steps of: generating a theoretical no load slide displacement curve, generating an actual slide displacement curve during a load condition of the press, determining the contact point on the actual slide displacement curve which corresponds to the slide contacting the stock material, establishing a start point on the slide downstroke between top dead center and the contact point, establishing an end point on the slide upstroke between top dead center and the contact point, identifying the points on the theoretical slide displacement curve corresponding to the start point and the end point, identifying the points on the actual slide displacement curve corresponding to the start point and the end point, superimposing the identified start points on the theoretical and actual slide displacement curves, and superimposing the identified end points on the theoretical and actual slide displacement curves. In this form of the invention, the method of monitoring performance parameters for a mechanical press further comprises the steps of: calculating the distance between the theoretical slide displacement curve and the actual slide displacement curve at a plurality of increments on the slide upstroke between the contact point and the end point, calculating the sum of the distances between the theoretical slide displacement curve and the actual slide displacement curve at each increment, shifting the actual slide displacement curve, calculating the sum of the distances between the theoretical slide displacement curve and the actual slide displacement curve at each increment, and repeating the shifting and calculating steps until the sum of the distances between the theoretical slide displacement curve and the actual slide displacement curve at each increment reaches a minimum value.

The invention, in another form thereof, comprises a method of monitoring performance parameters for a mechanical press. This method includes the steps of: generating a theoretical no load slide displacement curve, generating an actual slide displacement curve during a load condition of the press, determining the contact point on the actual slide displacement curve which corresponds to the slide contacting the stock material, establishing a start point on the slide downstroke between top dead center and the contact point, establishing an end point on the slide upstroke between top dead center and the contact point, identifying the points on the theoretical slide displacement curve corresponding to the start point and the end point, identifying the points on the actual slide displacement curve corresponding to the start point and the end point, superimposing the identified start points on the theoretical and actual slide displacement curves, and superimposing the identified end points on the theoretical and actual slide displacement curves. In this form of the invention, the method of monitoring performance parameters for a mechanical press further comprises the steps of: determining a value of dynamic deflection, determining the value of static stiffness for the press being monitored, providing a computational device, communicating the value of dynamic deflection and the value of static stiffness to the computational device, and calculating load on the press at any point in time by multiplying the value of dynamic deflection by the value of static stiffness. The step of determining a value of dynamic deflection includes measuring the distance along the ordinate between the theoretical no load slide displacement curve and the actual slide displacement curve to determine a difference in displacement between these two curves. After a value of dynamic deflection is determined, this value of dynamic deflection may be utilized to calculate load on the press for any time increment of a slide stroke. The calculated load for individual time increments may then be plotted vs. time to establish a load curve for an entire pressing cycle of the press.

The invention, in another form thereof, comprises a method of monitoring load on a mechanical press without using a contact load sensor. This method includes the steps of: determining a value of dynamic deflection, determining the value of static stiffness for the press being monitored, providing a computational device, communicating the value of dynamic deflection and the value of static stiffness to the computational device, and calculating load on the press at any point in time by multiplying the value of dynamic deflection by the value of static stiffness. The step of determining a value of dynamic deflection can further include the steps of: generating a theoretical no load value of slide displacement, generating an actual load value of slide displacement corresponding to the theoretical no load value of slide displacement, computing the difference between the theoretical no load value and the actual load value of slide displacement, and establishing the difference between the theoretical no load value and the actual load value of slide displacement as the value of dynamic deflection.

The invention, in another form thereof, comprises a method of monitoring load on a mechanical press without using a contact load sensor. This method includes the steps of: determining a value of dynamic deflection, determining the value of static stiffness for the press being monitored, providing a computational device, communicating the value of dynamic deflection and the value of static stiffness to the computational device, and calculating load on the press at any point in time by multiplying the value of dynamic deflection by the value of static stiffness. The method of monitoring load on a mechanical press without using a contact load sensor in this embodiment of the current invention further comprises the steps of: determining a plurality of values of dynamic deflection at increments of the entire slide stroke, calculating a plurality of load values corresponding to the plurality of dynamic deflection values, and generating a plot of load vs. time for a slide stroke of the press.

The invention, in another form thereof, comprises a speed sensor for sensing a value of press speed, input means for inputting a plurality of variables corresponding to characteristics of the press, storage means for storing an equation which can be used for generating a theoretical slide displacement curve, a computational device for generating a theoretical slide displacement curve, and a non-contact displacement sensor for sensing slide displacement during an actual load condition of the press. The equation stored in the storage means utilizes a plurality of variables corresponding to characteristics of the press and the value of press speed sensed by the sensor means to generate a theoretical slide displacement curve. The computational device is communicatively connected to the sensor means, the input means and the storage means so that the computational device may utilize the equation and its variables to generate a theoretical slide displacement curve. The computational device may further be utilized to plot sensed slide displacement from the non-contact displacement sensor vs. a count quantity. The computational device may further be utilized to match an actual load slide displacement curve generated by plotting the output of the non-contact displacement sensor for a slide stroke to the theoretical slide displacement curve. In an effort to match the theoretical slide displacement curve and the actual applied load displacement curve, the computational device can be utilized to determine the contact point on the actual slide displacement curve which corresponds to the slide contacting the stock material. The computational device may further be utilized to establish a start point and an end point on the slide downstroke between top dead center and the contact point and the slide upstroke between top dead center and the contact point, respectively. The computational device may then be utilized to identify the start point and the end point on both the theoretical slide displacement curve and on the actual slide displacement curve and to superimpose the identified start points and end points so that the theoretical and actual slide displacement curves can be compared to obtain indicators of press performance. In this form of the invention, the computational device may be, for example, a microprocessor. The count quantity against which the slide displacement is plotted can be, for example, a measure of time or crank angle.

The invention, in another form thereof, comprises a speed sensor for sensing the speed of a mechanical press, a non-contact displacement sensor for sensing slide displacement during an actual load condition of the press, input means for inputting a plurality of variables corresponding to characteristics of the press, and a computational device for computing a value of load on the press at any point of the slide stroke. The computational device is communicatively connected to the speed sensor, the non-contact displacement sensor and the input means. The computational device is utilized to compute a theoretical no load value of slide displacement and to compute a value of dynamic deflection by computing the difference between the theoretical no load value and the corresponding actual load value of slide displacement sensed during an actual load condition of the press. The computational device then multiplies the thusly determined value of dynamic deflection by the value of static stiffness for the mechanical press to determine a value of load on the press at a point of the slide stroke. The input means may be utilized for inputting variables including: a value of static stiffness corresponding to the press being monitored; an equation for generating theoretical slide displacement values which includes variables corresponding to press drive mechanism, connecting rod length, stroke length and bearing size; a value of connecting rod length; a value of stroke length; a value of drive type; and a value of bearing size.

An advantage of the present invention is the ability to accurately match a theoretical no load slide displacement curve for a mechanical press with an actual applied load slide displacement curve for a mechanical press.

Another advantage of the present invention is the ability to compute load on a mechanical press without utilizing a contact load sensor.

A further advantage of the present invention is the ability to graph load as a function of time so that it may be utilized to monitor the operational condition of a mechanical press.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 2:
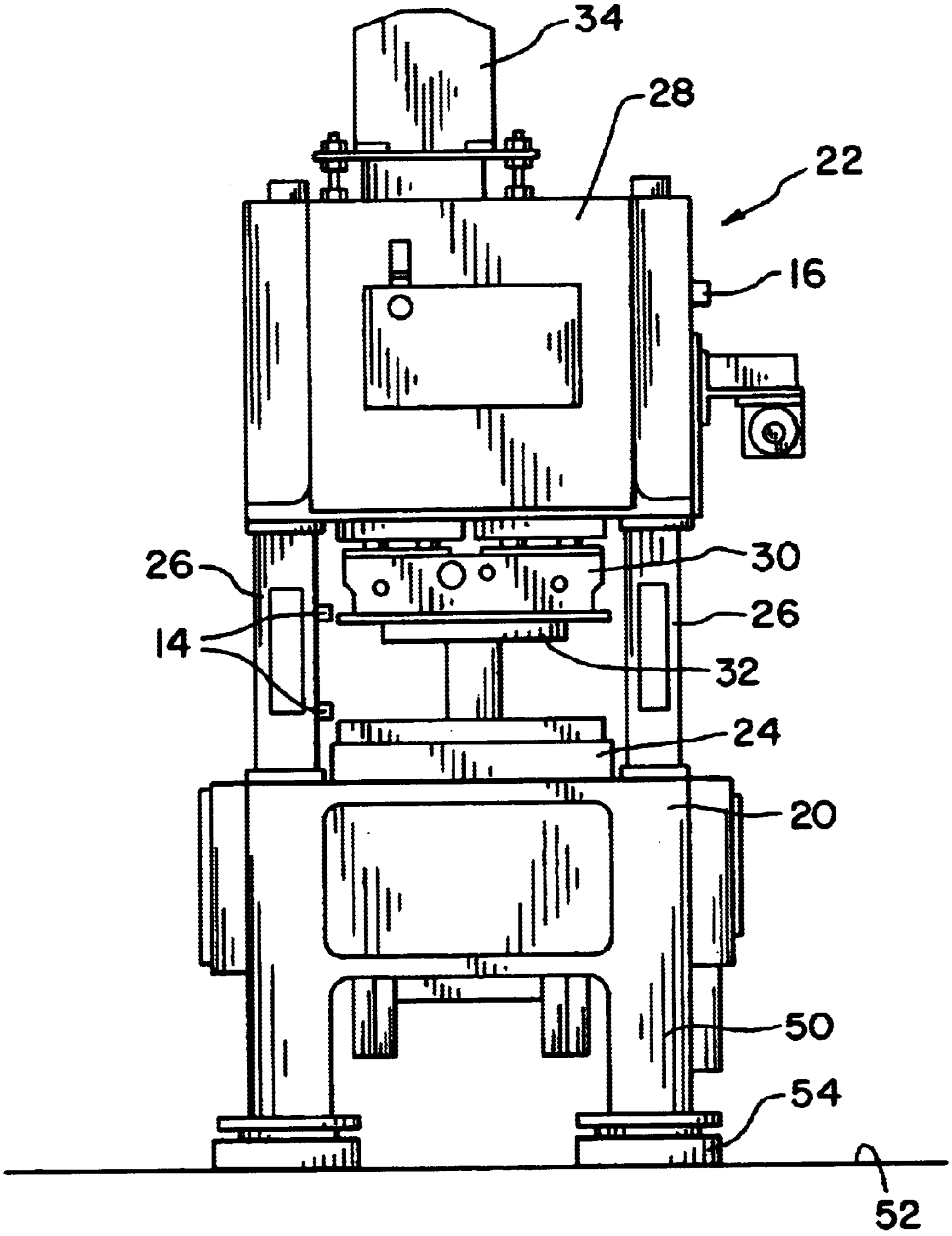
FIG. 2 is an elevational view of a typical press which is the subject of load monitoring.
Figure 3A:
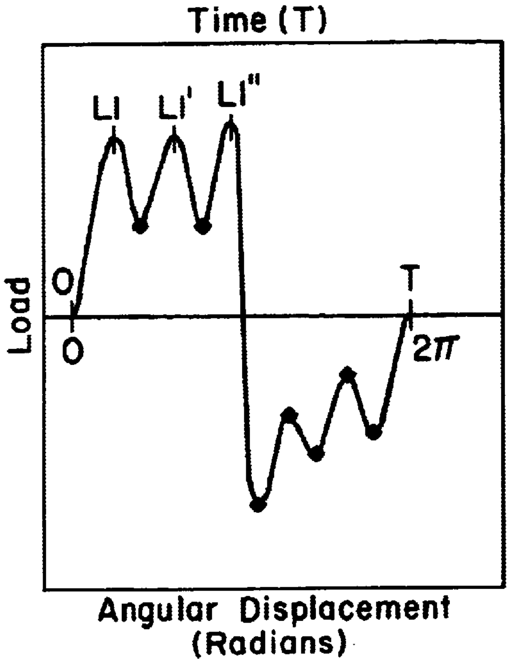
FIG. 3 is a graphical representation of load vs. time measurements for different press applications.
Figure 3B:
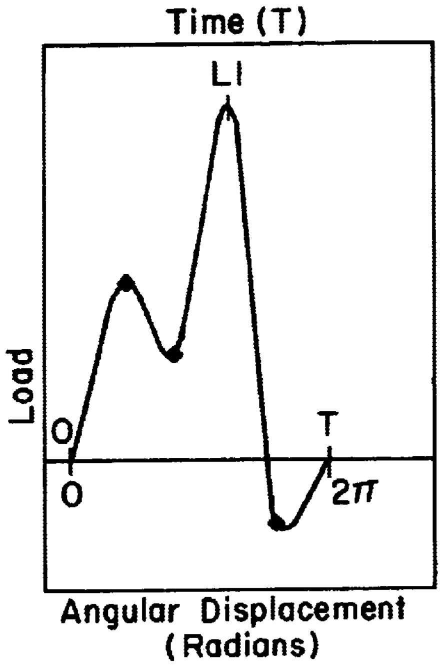
Figure 3C:
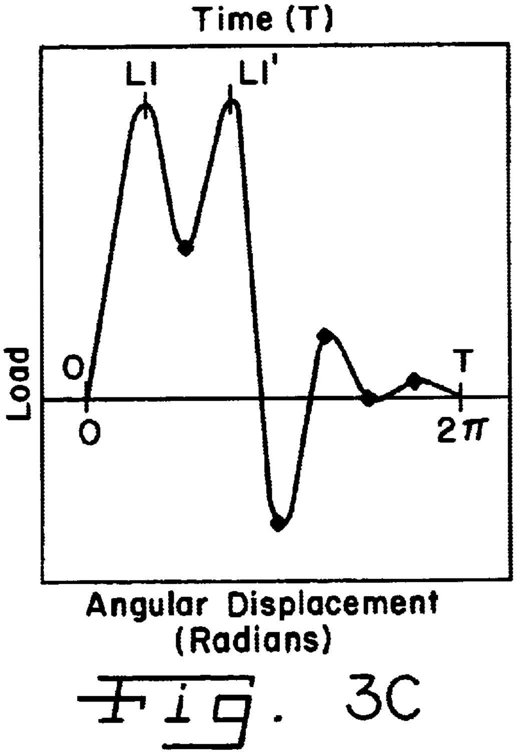
Figure 3D:
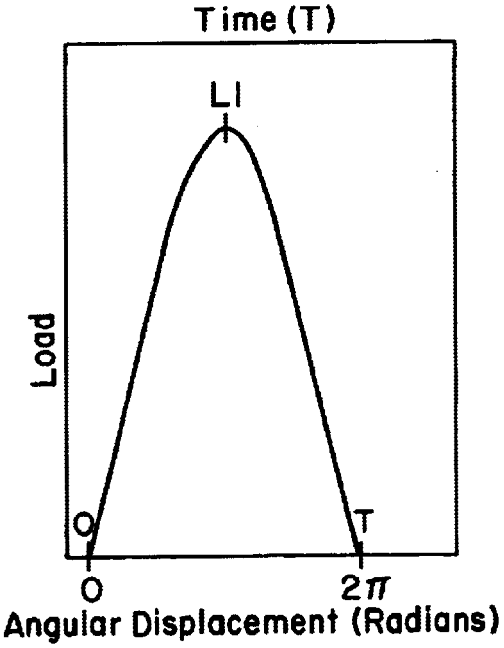

Referring now to the drawings and particularly to FIG. 2, there is depicted a typical press 22 having a bed 20 with a bolster 24. Attached vertically to bed 20 are uprights 26 which support crown 28. Above crown 28 and attached thereto is press motor 34. Slide 30 is operatively connected so that during operation, press motor 34 causes slide 30 to reciprocate in rectilinear fashion toward and away from bed 20. Tooling 32 is operatively connected to slide 30. Leg members 50 are formed as an extension of bed 20 and are generally mounted to shop floor 52 by means of shock absorbing pads 54.

Generally, the present invention utilizes a computational device to continually compute a theoretical no load slide displacement curve as well as to continually plot an actual slide displacement curve. The computational device is further used to employ a curve matching technique to match these two curves so that operational parameters of a mechanical press may be determined. Particularly, this information is utilized to compute a value of load on the press.

Figure 1:
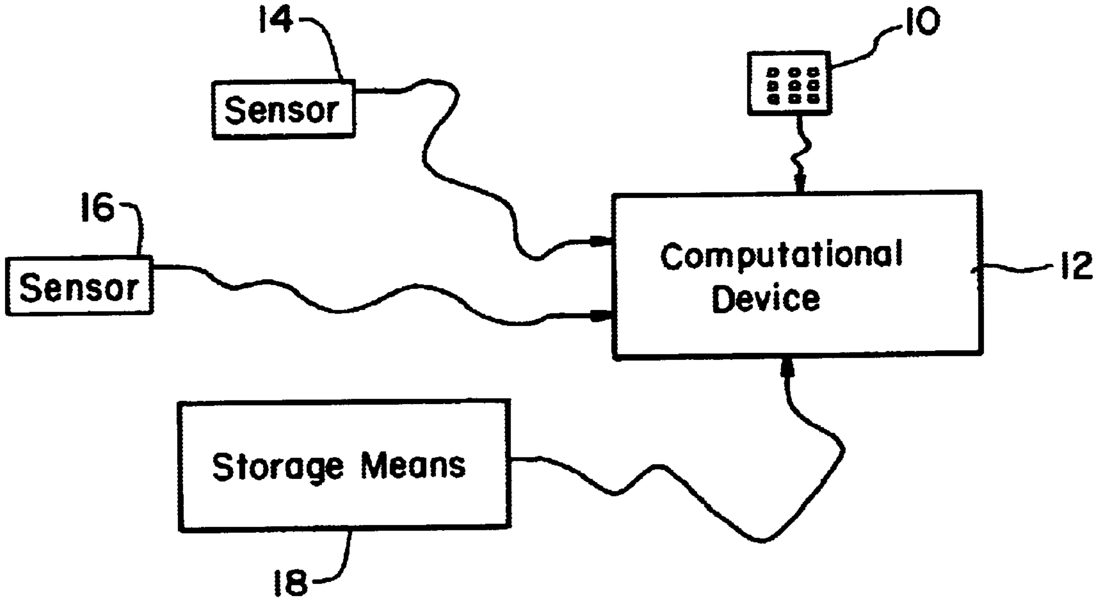
FIG. 1 is a schematic representation of an embodiment of the load computing apparatus.

FIG. 1 illustrates one embodiment of the invention wherein a computational device 12 receives sensed position values from non-contact displacement sensor 14. Non-contact displacement sensor 14 can be, for example, a hall effect sensor. Computational device 12 further receives a value of press speed (spm) from speed sensor 16. Storage means 18 stores an equation which includes variables corresponding to press parameters which effect slide displacement such as possibly including the speed of the press and variables associated with the geometry of the press. Storage means 18 is communicatively connected to computational device 12. Input means 10 are utilized to input press parameters corresponding to the geometry of the press and may additionally be utilized to input the equation for determining a theoretical slide displacement curve. Computational device 12 receives input from input means 10, non-contact displacement sensor 14, speed sensor 16 and storage means 18 and utilizes this information to continually generate, during press operation, a theoretical no load slide displacement curve and an actual slide displacement curve. These two curves are superimposed one on the other so that a comparison between the curves may be made to obtain operational parameters corresponding to the operating state of the press being monitored. Input means 10 may additionally be utilized to input a value of static stiffness corresponding to the press being monitored. Computational device 12 may utilize this value in conjunction with a value of dynamic deflection to compute load at any point of the slide stroke of the press being monitored.

During press operation, non-contact displacement sensor 14 continually monitors and communicates slide displacement values to computational device 12. Similarly, speed sensor 16 continually monitors and communicates press speed values to computational device 12. Prior to press monitoring, an equation for theoretically calculating slide displacement as a function of press speed is input into storage means 18. Prior to monitoring, input means 10 are utilized to enter press variables corresponding to the geometry of the press as well as a value of static stiffness ($K_{static}$) which has been empirically determined for the press being monitored.

Figure 4:
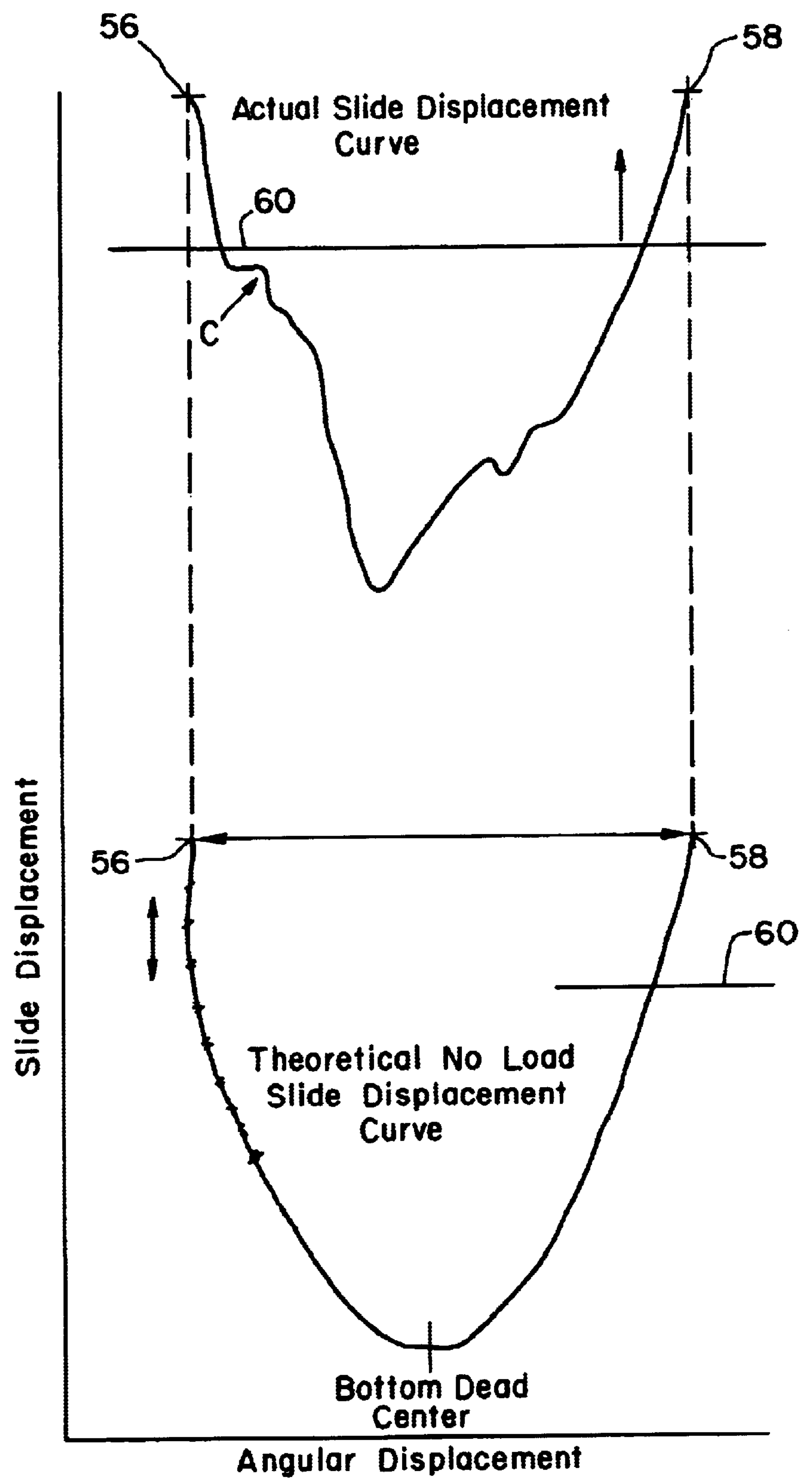
FIG. 4 is a graphical representation of an actual slide displacement curve and a theoretical no load slide displacement curve.

Computational device 12 continually utilizes speed values derived from speed sensor 16 in conjunction with the equation contained in storage means 18 and the press variables input through input means 10 to generate a theoretical no load slide displacement curve. FIG. 4 depicts such a generated theoretical no load slide displacement curve.

Computational device 12 continually receives slide displacement values from non-contact displacement sensor 14 and plots an actual slide displacement curve. Such an actual slide displacement curve is depicted in FIG. 4. Computational device 12 continually computes both a theoretical slide displacement curve and an actual slide displacement curve during operation of the press being monitored. Computational device 12 then employs a curve matching technique to superimpose these two curves in an effort to obtain operational parameters of the press being monitored.

Figure 5A:
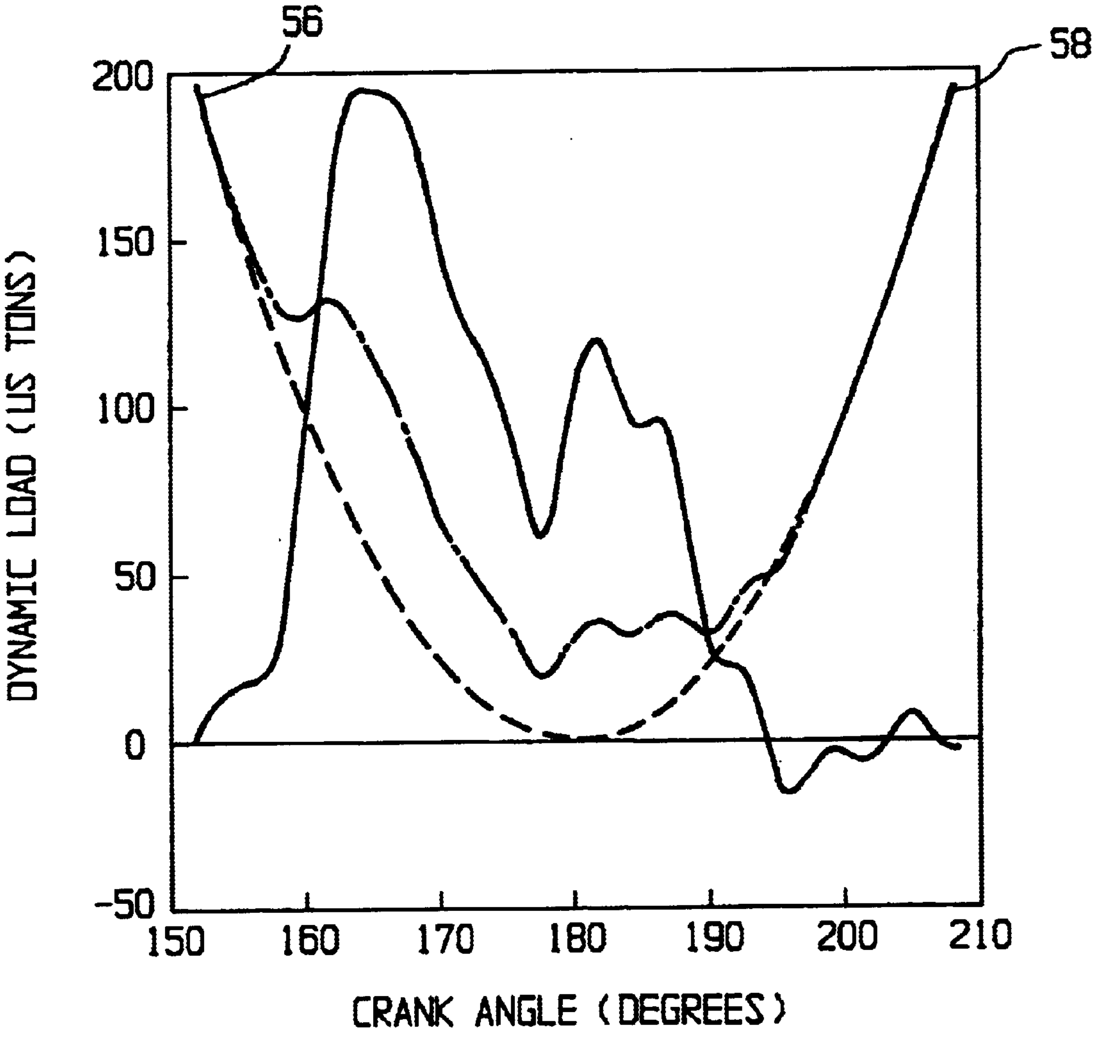
FIG. 5A is a graphical representation of a theoretical no load slide displacement curve superimposed with an actual slide displacement curve and a corresponding force curve representing a graph of the load experienced during a slide stroke of a mechanical press.
Figure 5B:
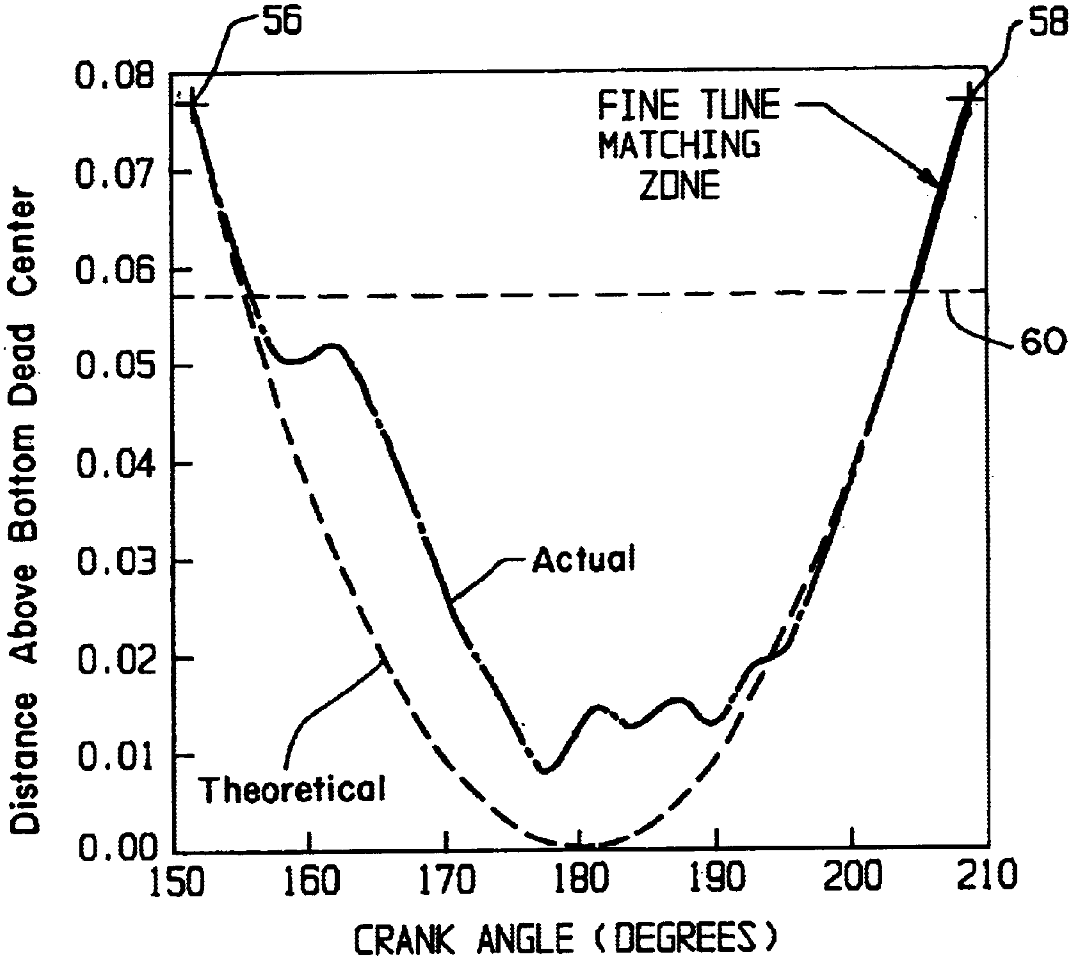
FIG. 5B is a graphical representation of a theoretical no load slide displacement curve superimposed with an actual slide displacement curve.

To match the actual slide displacement curve and the theoretical no load slide displacement curve, computational device 12 first identifies start point 56 and end point 58 on both of these curves. Start point 56 is a point on the downstroke and is chosen as a point on the slide path between contact point 60 (i.e. where the slide contacts the stock material) and top dead center. Similarly, end point 58 is chosen as a point on the slide upstroke between the contact point and top dead center. To superimpose the actual slide displacement curve and the theoretical no load slide displacement curve, computational device 12 matches start points 56 and end points 58. After these two points have been matched, computational device 12 utilizes a fine tuning method which shifts the actual slide displacement curve until the sum of the incremental distances between the actual slide displacement curve and the theoretical no load slide displacement curve above the contact point on the upstroke of the slide are minimized. FIG. 5B illustrates curves matched using this method. In this way, a value of load on the press may be continually computed during press operation so that a load vs. time curve may be generated.

FIG. 3 graphically depicts four load vs. time curves for different press applications. As depicted in FIG. 3, different press applications may have the same peak compressive load (L1) and yet have very different impulse energy values. The value of utilizing impulse energy as an indicator of press performance is outlined in pending U.S. Provisional Patent Application Ser. No. 60/159,818, the disclosure of which is herein explicitly incorporated by reference. Since impulse energy provides a reliable indicator of press operating condition, it is advantageous that the current invention can continually compute values of load during press operation. FIG. 5A graphically depicts a superimposed actual slide displacement curve with a theoretical no load slide displacement curve as well as a force vs. slide position curve generated by the method and apparatus of the current invention. Computational device 12 may be communicatively connected to a visual display device, an alert signal, press shutoff signal or a digital storage device which will store historical data for the press being monitored. Computational device 12 may further be connected to a modem or otherwise to a remote source where press operational condition may be usefully communicated.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of generating a theoretical no-load slide displacement curve for a mechanical press, comprising:

determining press variables to account for press parameters which effect slide displacement and thereby have a direct influence on the theoretical no-load slide displacement curve for the mechanical press;

providing a computational device;

determining a speed of the press;

communicating the speed of the press and values of the press variables to the computational device;

generating a theoretical no-load distance above bottom dead center for each increment of a slide stroke, using said speed of the press and said values of the press variables; and plotting the generated theoretical no-load distance above bottom dead center values vs. time.

2. The method of claim 1, wherein said step of determining the press variables comprises:

determining an appropriate variable corresponding to a press drive geometry of the mechanical press;

determining an appropriate variable corresponding to a connecting rod length of the mechanical press;

determining an appropriate variable corresponding to a stroke length of the mechanical press; and determining an appropriate variable corresponding to a bearing size of the mechanical press.

3. An apparatus for generating a theoretical no-load slide displacement curve for a mechanical press, comprising:

a speed sensor for sensing a value of press speed;

input means for inputting a plurality of variables corresponding to characteristics of the press; and computer processor means for generating a theoretical no-load slide displacement curve, said computer processor means utilizing said plurality of variables corresponding to characteristics of the press and said value of press speed to generate the theoretical no-load slide displacement curve, said computer processor means communicatively connected to said speed sensor and said input means.

4. The apparatus as recited in claim 3, wherein said plurality of variables comprises:

a value of a connecting rod length;

a value of a stroke length;

a value of a press drive geometry; and a value of a bearing size.

5. A method of monitoring performance parameters for a mechanical press, comprising:

generating a theoretical no load slide displacement curve for the press;

generating an actual slide displacement curve during a load condition of the press;

determining a contact point on the actual slide displacement curve, the contact point corresponding to the slide contacting the stock material;

establishing a start point on a slide downstroke between top dead center and the contact point;

establishing an end point on a slide upstroke between top dead center and the contact point;

identifying points on the theoretical no load slide displacement curve corresponding to the start point and the end point;

identifying points on the actual slide displacement curve corresponding to the start point and the end point;

superimposing the identified start points on the theoretical and actual slide displacement curves; and superimposing the identified end points on the theoretical and actual slide displacement curves so that the theoretical and actual slide displacement curves are compared to obtain indicators of press performance.

6. The method of claim 5, wherein said step of generating a theoretical no load slide displacement curve comprises:

determining a speed of the mechanical press;

determining an appropriate variable corresponding to a press drive geometry of the mechanical press;

determining an appropriate variable corresponding to a connecting rod length of the mechanical press;

determining an appropriate variable corresponding to a stroke length of the mechanical press;

determining an appropriate variable corresponding to a bearing size of the mechanical press;

providing a computational device;

communicating the speed of the press and the appropriate variables to the computational device;

generating a theoretical no load distance above bottom dead center for each time increment of a slide stroke based upon the speed of the press and the appropriate variables; and plotting the theoretical no load distance above bottom dead center values vs. time.

7. The method of claim 5, wherein said step of generating an actual slide displacement curve during a load condition of the press comprises:

monitoring the displacement of the slide of the press; and plotting slide displacement vs. crank angle.

8. The method of claim 5, wherein said step of generating an actual slide displacement curve during a load condition of the press comprises:

monitoring the displacement of the slide of the press; and plotting slide displacement vs. time.

9. The method of claim 5, wherein said step of generating an actual slide displacement curve during a load condition of the press comprises:

monitoring the displacement of the slide of the press using a non-contact displacement sensor; and plotting slide displacement vs. crank angle.

10. The method of claim 5, wherein said step of generating an actual slide displacement curve during a load condition of the press comprises:

monitoring the displacement of the slide of the press using a non-contact displacement sensor; and plotting slide displacement vs. time.

11. The method of claim 5, wherein said step of determining the contact point on the actual slide displacement curve comprises:

determining a first inflection point on the actual slide displacement curve; and establishing the contact point on the actual slide displacement curve as the first inflection point on the actual slide displacement curve.

12. The method of claim 5, further comprising:

calculating a distance between the theoretical no load slide displacement curve and the actual slide displacement curve at a plurality of increments on the slide upstroke between the contact point and the end point;

calculating initially a sum of the distances between the theoretical no load slide displacement curve and the actual slide displacement curve at each increment;

shifting the actual slide displacement curve;

recalculating the sum of the distances between the theoretical no load slide displacement curve and the actual slide displacement curve at each increment; and repeating the shifting and recalculating steps until the sum of the distances between the theoretical no load slide displacement curve and the actual slide displacement curve at each increment reaches a minimum value.

13. The method of claim 5, further comprising:

determining a value of dynamic deflection;

determining a value of static stiffness for the press being monitored;

providing a computational device;

communicating the value of dynamic deflection and the value of static stiffness to the computational device; and calculating load on the press at any point of the slide stroke by multiplying the value of dynamic deflection for a relevant point of the slide stroke by the value of static stiffness.

14. The method of claim 13, wherein said step of determining a value of dynamic deflection comprises:

measuring a distance along the ordinate between the theoretical no load slide displacement curve and the actual slide displacement curve.

15. The method of claim 14, further comprising:

calculating load on the press for each time increment of a slide stroke; and plotting calculated load vs. time.

16. An apparatus for monitoring a running press, comprising:

a speed sensor for sensing a value of press speed;

input means for inputting a plurality of variables corresponding to characteristics of the press;

computational device for generating a theoretical no load slide, displacement curve, said computational device utilizing said plurality of variables corresponding to characteristics of the press and said value of press speed to generate the theoretical no load slide displacement curve, said computational device communicatively connected to said sensor means and said input means; and a non-contact displacement sensor for sensing slide displacement during an actual load condition of the press, said non-contact displacement sensor communicatively connected to said computational device, said computational device plotting sensed slide displacement vs. a count quantity, said computational device determining a contact point on the actual slide displacement curve which corresponds to the slide contacting a stock material, said computational device establishing a start point on a slide downstroke between top dead center and the contact point, said computational device establishing an end point on a slide upstroke between top dead center and the contact point, said computational device identifying points on the theoretical no load slide displacement curve corresponding to the start point and the end point, said computational device identifying points on the actual slide displacement curve corresponding to the start point and the end point, said computational device superimposing the identified start points on the theoretical and actual slide displacement curves, said computational device superimposing the identified end points on the theoretical and actual slide displacement curves so that the theoretical and actual slide displacement curves are compared to obtain indicators of press performance.

17. The apparatus as recited in claim 16, wherein said computational device comprises:

a microprocessor.

18. The apparatus as recited in claim 16, wherein said plurality of variables comprises:

a value of a connecting rod length;

a value of a stroke length;

a value of a press drive geometry; and a value of a bearing size.

19. The apparatus as recited in claim 16, wherein said count quantity is a measure of time.

20. The apparatus as recited in claim 16, wherein said count quantity is a measure of crank angle.

21. An apparatus for monitoring a load on a mechanical press, comprising:

a speed sensor for sensing a speed of the press;

a non-contact displacement sensor for sensing slide displacement during an actual load condition of the press;

input means for inputting a plurality of press variables corresponding to characteristics of the press; and a computational device, said computational device communicatively connected to said speed sensor, said non-contact displacement sensor and said input means, said computational device generating a theoretical no load value of slide displacement based upon the speed of the press and the plurality of press variables, said computational device computing a value of dynamic deflection by computing the difference between the theoretical no load value and the corresponding actual load value of slide displacement, said computational device multiplying the value of dynamic deflection by a value of static stiffness of the mechanical press to determine a value of load on the press at a point of the slide stroke.

22. The apparatus as recited in claim 21, wherein said plurality press of variables comprises:

a value of static stiffness corresponding to the press being monitored;

a value of a connecting rod length;

a value of a stroke length;

a value of a press drive geometry; and a value of a bearing size.

* * * * *